(12) United States Patent
Yang et al.

(10) Patent No.: US 12,475,854 B2
(45) Date of Patent: Nov. 18, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zhongliu Yang, Beijing (CN); Zhengkun Li, Beijing (CN); Haigang Qing, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/686,500

(22) PCT Filed: Sep. 22, 2022

(86) PCT No.: PCT/CN2022/120502
§ 371 (c)(1),
(2) Date: Feb. 26, 2024

(87) PCT Pub. No.: WO2024/060127
PCT Pub. Date: Mar. 28, 2024

(65) Prior Publication Data
US 2025/0124874 A1  Apr. 17, 2025

(51) Int. Cl.
*G09G 3/3258* (2016.01)

(52) U.S. Cl.
CPC ... *G09G 3/3258* (2013.01); *G09G 2300/0408* (2013.01); *G09G 2300/0426* (2013.01);
(Continued)

(58) Field of Classification Search
CPC ......... H10K 59/131; G09G 2300/0408; G09G 2300/0426; G09G 2300/0861; G09G 2320/0233; G09G 2330/023; G09G 3/3258
See application file for complete search history.

(56) References Cited

U.S. PATENT DOCUMENTS 10,741,626 B1 * 8/2020 Zhang ................ H10K 59/1213

FOREIGN PATENT DOCUMENTS

| CN | 113707704 A | 11/2021 |
| CN | 114361228 A | 4/2022 |
| WO | WO 2021249152 A1 | 12/2021 |

* cited by examiner

*Primary Examiner* — Robin J Mishler
(74) *Attorney, Agent, or Firm* — HOUTTEMAN LAW LLC

(57) ABSTRACT

A display substrate and a display apparatus are provided. The display substrate includes a base substrate including a display region and a peripheral region; a driving functional layer on one side of the base substrate and including pixel driving circuits in the display region and arranged in an array along a first and second directions intersecting with each other; a first conductive layer on a side of the driving functional layer away from the base substrate and including first power lines for providing a first operating voltage; a first planarization layer and a second conductive layer between the driving functional layer and the first conductive layer. The first planarization layer is between the first and second conductive layers, and the second conductive layer includes a first conductive pattern electrically connected in parallel with a corresponding first power line through a first via in the first planarization layer.

18 Claims, 7 Drawing Sheets

(52) U.S. Cl.
CPC .............. *G09G 2300/0861* (2013.01); *G09G 2320/0233* (2013.01); *G09G 2330/023* (2013.01)

Active semiconductor layer 4

Fifth conductive layer CL5

Fourth conductive layer CL4

Third conductive layer CL3

Passivation layer PVX

DISPLAY SUBSTRATE AND DISPLAY APPARATUS

TECHNICAL FIELD

The present disclosure relates to the field of display technology, and in particular to a display substrate and a display apparatus.

BACKGROUND

With the rapid development of the display industry, an organic light-emitting diode (OLED) display apparatus is the most common display apparatus, and has attracted much attention and developed in the field of display technology.

In recent years, a display product is being updated and iterated, and a size of a display apparatus is gradually increased. Accordingly, a long range uniformity of the display apparatus is poor. Therefore, in a case where the requirements of large size, narrow bezel and low power consumption of the display apparatus are satisfied, increase of the long range uniformity of the display apparatus is a problem to be solved.

SUMMARY

Embodiment of the present disclosure provides a display substrate and a display apparatus.

In a first aspect, the embodiments of the present disclosure provide a display substrate, including: a base substrate including a display region and a peripheral region surrounding the display region; a driving functional layer on one side of the base substrate, and including: pixel driving circuits in the display region and in an array along a first direction and a second direction, wherein the first direction intersects with the second direction; a first conductive layer on a side of the driving functional layer away from the base substrate, and including a plurality of first power lines configured to provide a first operating voltage to the pixel driving circuits; and a first planarization layer and a second conductive layer both between the driving functional layer and the first conductive layer, wherein the first planarization layer is between the first conductive layer and the second conductive layer, the second conductive layer includes a plurality of first conductive patterns, and the plurality of first conductive patterns are electrically connected in parallel with the corresponding first power lines through first vias in the first planarization layer.

In some embodiments, the plurality of first power lines extend in the second direction, and the plurality of first conductive patterns extend in the second direction; and an orthographic projection of each first conductive pattern on the base substrate at least partially overlaps with an orthographic projection of the corresponding first power line on the base substrate.

In some embodiments, the first conductive layer further includes first peripheral power lines in the peripheral region configured to transmit the first operating voltage; the second conductive layer further includes second conductive patterns in the peripheral region; and the second conductive patterns are electrically connected in parallel to the corresponding first peripheral power lines through second vias in the first planarization layer.

In some embodiments, the driving functional layer includes a plurality of gate lines extending along the first direction, and the pixel driving circuits are electrically connected to the corresponding gate lines; the driving functional layer includes a third conductive layer on a side of the second conductive layer close to the base substrate and including the plurality of gate lines; the first conductive layer further includes: fourth power lines in the peripheral region and configured to provide a second operating voltage to the pixel driving circuits; and/or, the third conductive layer includes: fifth power lines in the peripheral region and configured to provide the second operating voltage to the pixel driving circuits; and the second conductive layer further includes: third conductive patterns, and the third conductive patterns are electrically connected in parallel with the corresponding fourth power lines and/or the corresponding fifth power lines.

In some embodiments, the driving functional layer includes a plurality of gate lines extending along the first direction, and the pixel driving circuits are electrically connected to the corresponding gate lines; the driving functional layer includes a third conductive layer on a side of the second conductive layer close to the base substrate and including the plurality of gate lines; the third conductive layer further includes: a plurality of second power lines configured to transmit the first operating voltage and extending in the first direction, and the display substrate further includes: a passivation layer between the second conductive layer and the third conductive layer, wherein the first conductive patterns are electrically connected to the corresponding second power lines through third vias in the passivation layer.

In some embodiments, the driving functional layer further includes: a fourth conductive layer on a side of the third conductive layer close to the base substrate, and a fifth conductive layer on a side of the fourth conductive layer close to the base substrate; each pixel driving circuit includes a driving transistor and a storage capacitor, wherein a first plate of the storage capacitor is electrically connected to the first power line, and a second plate of the storage capacitor is electrically connected to a control electrode of the driving transistor; the first plate of the storage capacitor is in the fourth conductive layer, and the second plate of the storage capacitor and the control electrode of the driving transistor are in the fifth conductive layer; and the display substrate further includes: an interlayer insulating layer between the third conductive layer and the fourth conductive layer.

In some embodiments, the fourth conductive layer further includes: a plurality of third power lines configured to transmit the first operating voltage, and each third power line is connected to the first plate of the storage capacitor and extends in the first direction; and the plurality of third power lines are electrically connected to the corresponding second power lines through fourth vias in the interlayer insulating layer In some embodiments, each pixel driving circuit further includes: a first reset transistor, a control electrode of the first reset transistor is electrically connected to a first reset control signal line, a first electrode of the first reset transistor is electrically connected to a first reset voltage transmission line, and a second electrode of the first reset transistor is electrically connected to the control electrode of the driving transistor; the first reset voltage transmission line is in the fourth conductive layer and extends along the first direction, the first conductive layer further includes: reset voltage connection lines in the first conductive layer and extending along the second direction; and the first reset voltage transmission lines corresponding to two adjacent pixel driving circuits in the second direction are electrically connected to each other through the corresponding reset voltage connection line.

In some embodiments, the third conductive layer further includes: first adapter electrodes; and the first reset voltage transmission lines are electrically connected to the corresponding reset voltage connection lines through the first adapter electrodes; the first reset voltage transmission lines are electrically connected to the corresponding first adapter electrodes through fifth vias in the passivation layer; and the second conductive layer further includes fourth conductive patterns, and an orthographic projection of each fourth conductive pattern on the base substrate covers an orthographic projection of a portion of the corresponding first adapter electrode exposed by the fifth via on the base substrate.

In some embodiments, an orthographic projection of the first power line corresponding to each storage capacitor on the base substrate covers an orthographic projection of the first reset transistor corresponding to the same storage capacitor on the base substrate.

In some embodiments, the first conductive layer further includes a plurality of data lines extending in the second direction; and each pixel driving circuit further includes a data writing transistor, a control electrode of the data writing transistor is electrically connected to the corresponding gate line, a first electrode of the data writing transistor is electrically connected to the corresponding data line, and a second electrode of the data writing transistor is electrically connected to the first electrode of the driving transistor.

In some embodiments, the third conductive layer further includes: second adapter electrodes, each data line is electrically connected to the first electrode of the corresponding data writing transistor through the second adapter electrode; each data line is electrically connected to the corresponding second adapter electrode through a sixth via in the passivation layer; and the second conductive layer further includes fifth conductive patterns, and an orthographic projection of each fifth conductive pattern on the base substrate covers an orthographic projection of a part of the corresponding second adapter electrode exposed by the sixth via on the base substrate.

In some embodiments, the display substrate further includes light-emitting elements on a side of the first conductive layer away from the base substrate, each light-emitting element including: a first electrode, a light-emitting layer, and a second electrode provided sequentially in a direction away from the first conductive layer; each pixel driving circuit further includes: a second light-emitting control transistor, a control electrode of the second light-emitting control transistor is electrically connected to a light-emitting control signal line, a first electrode of the second light-emitting control transistor is electrically connected to the second electrode of the driving transistor, and a second electrode of the second light-emitting control transistor is electrically connected to the first electrode of the corresponding light-emitting element; the third conductive layer further includes: third adapter electrodes, and the second electrode of the second light-emitting control transistor is electrically connected to the first electrode of the corresponding light-emitting element through the third adapter electrode; the first electrode of the light-emitting element is electrically connected to the corresponding third adapter electrode through a seventh via in the passivation layer; and the second conductive layer further includes sixth conductive patterns, and an orthographic projection of each sixth conductive pattern on the base substrate covers an orthographic projection of the portion of the corresponding third adapter electrode exposed by the seventh via on the base substrate.

In some embodiments, the first conductive layer further includes: fourth adapter electrodes, and the first electrode of the light-emitting element is electrically connected to the corresponding third adapter electrode through the fourth adapter electrode; each fourth adapter electrode is in contact with the corresponding sixth conductive pattern through a via in the first planarization layer; and each sixth conductive pattern is in contact with the corresponding third adapter electrode through the corresponding seventh via.

In a second aspect, the embodiments of the present disclosure provide a display apparatus, including the display substrate in the first aspect.

BRIEF DESCRIPTION OF DRAWINGS

The accompanying drawings, which are provided for further understanding of the present disclosure and constitute a part of this specification, are for explaining the present disclosure together with the embodiments of the present disclosure, but are not intended to limit the present disclosure. In the drawings.

Figure 1:
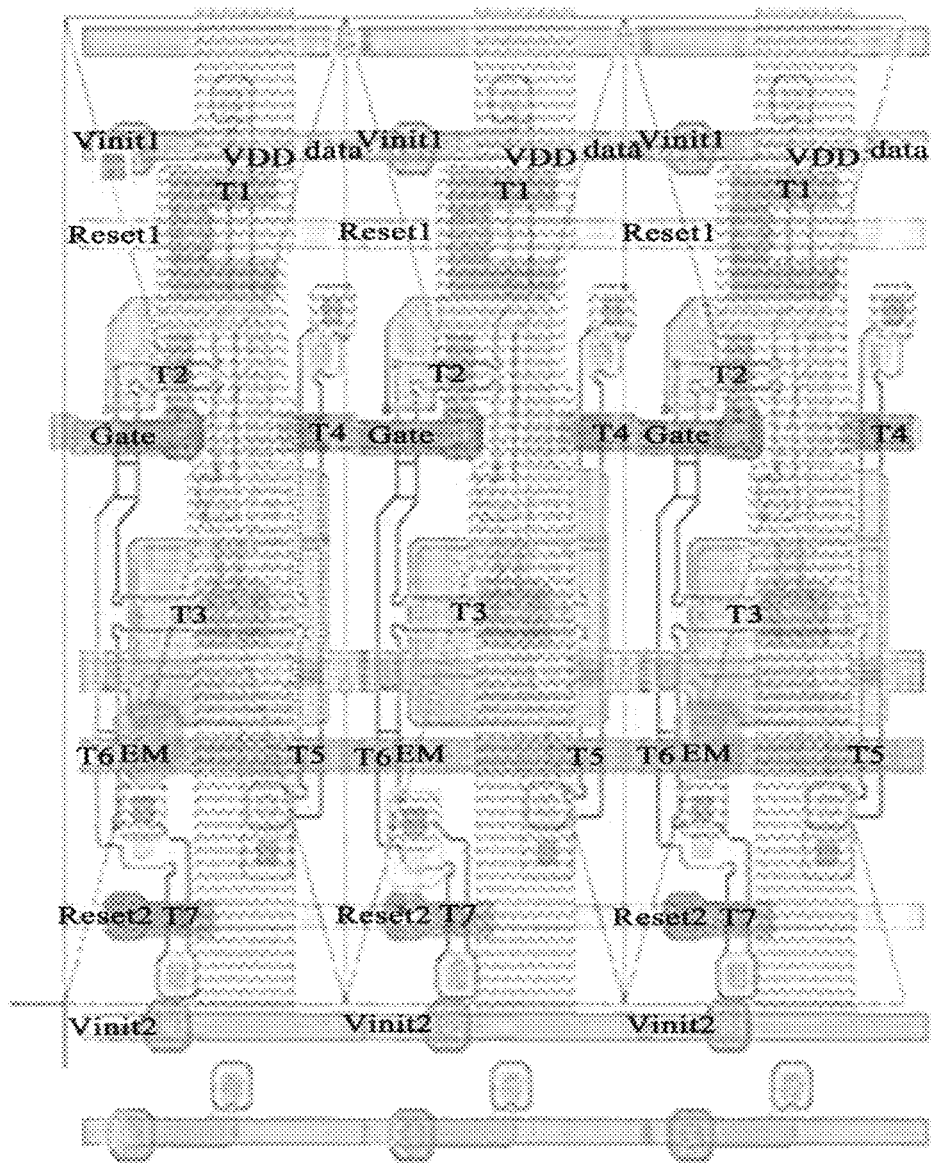
FIG. 1 is a layout of a pixel driving circuit according to an embodiment of the present disclosure.

Reference numerals are described as below:

A display region AA, a peripheral region NA;

A base substrate 1, a driving functional layer 2, a pixel defining layer PDL, a light-emitting element EL, a first electrode 31, a second planarization layer PLN2, a first conductive layer CL1, a first planarization layer PLN1, a second conductive layer CL2, a passivation layer PVX, a third conductive layer CL3, an interlayer insulating layer ILD, a fourth conductive layer CL4, a second insulating layer GI2, a fifth conductive layer CL5, a first insulating layer GI1, and an active semiconductor layer 4;

A first conductive pattern a1, a second conductive pattern a2, a third conductive pattern a3, a fourth conductive pattern a4, a fifth conductive pattern a5, a sixth conductive pattern a6; a first adapter electrode b1, a second adapter electrode b2, a third adapter electrode b3 and a fourth adapter electrode b4;

A first power line Vdd1, a second power line Vdd2, a third power line Vdd3, a fourth power line Vss1, a fifth power line Vss2 and a first peripheral power line Vdd4;

A data line Data, a gate line Gate, a reset voltage connection line L1, a first reset voltage transmission line Vinit1, a second reset voltage transmission line Vinit2, a first reset control signal line Reset1, a second reset control signal line Reset2, a connection line L2;

A third via k3, a fifth via k5, a sixth via k6, a seventh via k7;

A first reset transistor T1, a threshold compensation transistor T2, a driving transistor T3, a data writing transistor T4, a first light-emitting control transistor T5, a second light-emitting control transistor T6, a second reset transistor T7, a storage capacitor C, a first plate C_1, a second plate C_2.

DETAIL DESCRIPTION OF EMBODIMENTS

The embodiments of the present disclosure will be described below in detail with reference to the accompanying drawings. It should be understood that, the embodiments of the present disclosure described herein are only used to illustrate and explain, not limit, the present disclosure.

To make the objects, technical solutions and advantages of embodiments of the present disclosure more apparent, the technical solutions of the embodiments of the present disclosure will be described clearly and completely with reference to the drawings accompanying the embodiments of the present disclosure. It is obvious that the described embodiments are only a part of embodiments of the present disclosure, not all embodiments of the present disclosure. All other embodiments, which can be derived by one of ordinary skill in the art from the embodiments of the present disclosure without making any inventive effort, shall fall within the protection scope of the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Transistors involved in the embodiments of the present disclosure may be thin film transistors, field effect transistors, or other devices with the same and similar characteristics. A source electrode and a drain electrode of each transistor are symmetrical with respect to each other, so there is no difference between the source electrode and the drain electrode of the transistor. In the embodiments of the present disclosure, to distinguish the source electrode and the drain electrode of the transistor from each other, one of the source electrode and the drain electrode is referred to as a first electrode, and the other electrode is referred to as a second electrode. A gate electrode of the transistor is called a control electrode. In addition, the transistor includes a P-type transistor or an N-type transistor according to the characteristic of the transistor. When the P-type transistor is adopted, a first electrode is a drain electrode of the P-type transistor, a second electrode is a source electrode of the P-type transistor. When the N-type transistor is adopted, a first electrode is a source electrode of the N-type transistor, and a second electrode is a drain electrode of the N-type transistor. The N-type transistor is turned on when a high level signal is applied to its control electrode and turned off when a low level signal is applied to its control electrode, and the P-type transistor is turned on when a low level signal is applied to its control electrode and turned off when a high level signal is applied to its control electrode. In the embodiments of the present disclosure, the transistors are exemplarily described as P-type transistors.

With the development of display technology, an OLED display apparatus has become the most common display apparatus, and has many advantages of self-luminescence, fast response speed, wide viewing angle, and the like, and thus, is widely used. For a display apparatus, the brightness uniformity is an important factor affecting the display effect and the long range uniformity (LRU) is currently used in the art to evaluate the performance of the display apparatus.

In the related art, in the OLED display apparatus, each pixel includes a light-emitting device, including an anode electrically connected to a driving chip for supplying an anode voltage Vdd to the light-emitting device, a light-emitting layer, and a cathode for supplying a cathode voltage Vss. However, lines Vdd connected to the anode have a certain resistivity and have a certain voltage drop (IR Drop), and the voltage drop increases as a distance from a port of the driving chip increases. Therefore, in pixels farther from the driving chip, the lower the anode voltage Vdd actually obtained by the light-emitting device is, the lower a voltage Vds across the light-emitting device is. The voltage across the OLED is a difference between the anode voltage Vdd and the cathode voltage Vss of the OLED. However, under the same data voltage, i.e., under the same gray scale, the lower the voltage across the OLED is, the lower the brightness of the OLED is, and thus, the lower the brightness of the pixel farther away from the driving chip is, so that there is a brightness difference at different positions of the display substrate, and the LRU of the display substrate is lower, and the display effect is poor.

A large-sized and high-resolution display substrate has the greater number of rows of pixels arranged in an array, and a voltage between a near end and a far end of the driving chip is larger, so that a poor display caused by the voltage drop in the lines Vdd is more likely to occur.

In addition, when the pixel at the far end of the driving chip needs to have an enough brightness under a high-brightness picture, an amplitude of the anode voltage Vdd is inevitably increased to ensure the brightness, which inevitably brings a new problem of increased power consumption. Meanwhile, light-emitting materials of the light-emitting layer in the light-emitting device are differently consumed, which easily causes the service lives of different blocks of the display substrate to be different.

In order to solve at least one of the above technical problems, embodiments of the present disclosure provide a display substrate, which can reduce a voltage drop difference in a display apparatus and improve brightness uniformity.

Figure 2:
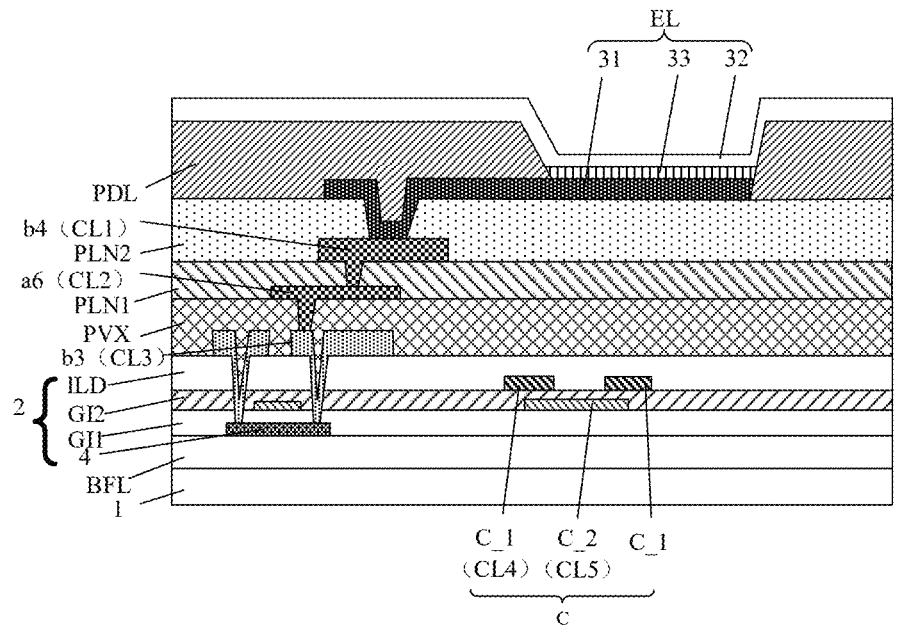
FIG. 2 is a schematic diagram of a structure of a display substrate according to an embodiment of the present disclosure.
Figure 3:
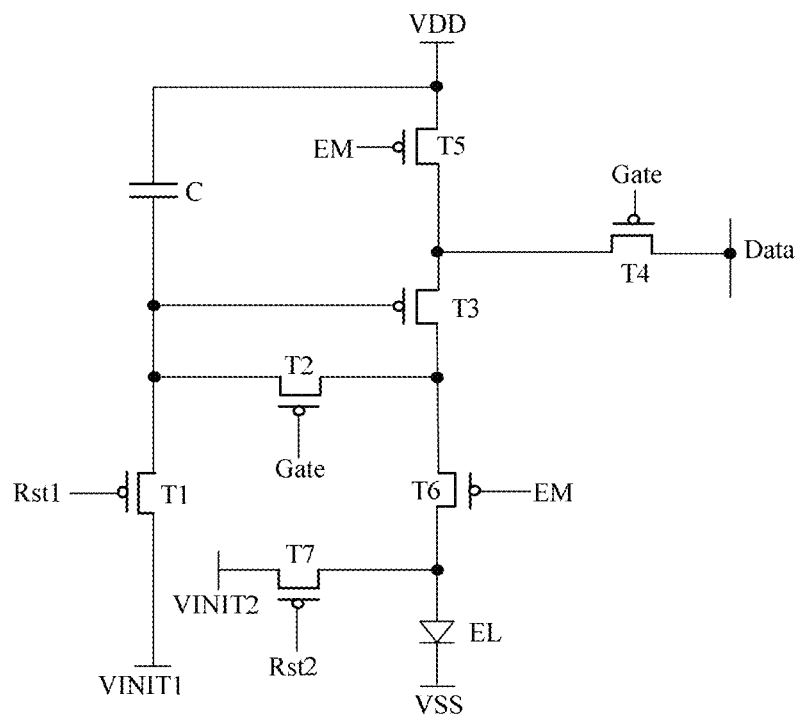
FIG. 3 is a schematic diagram of a circuit structure of a pixel driving circuit according to an embodiment of the present disclosure.
Figure 4:
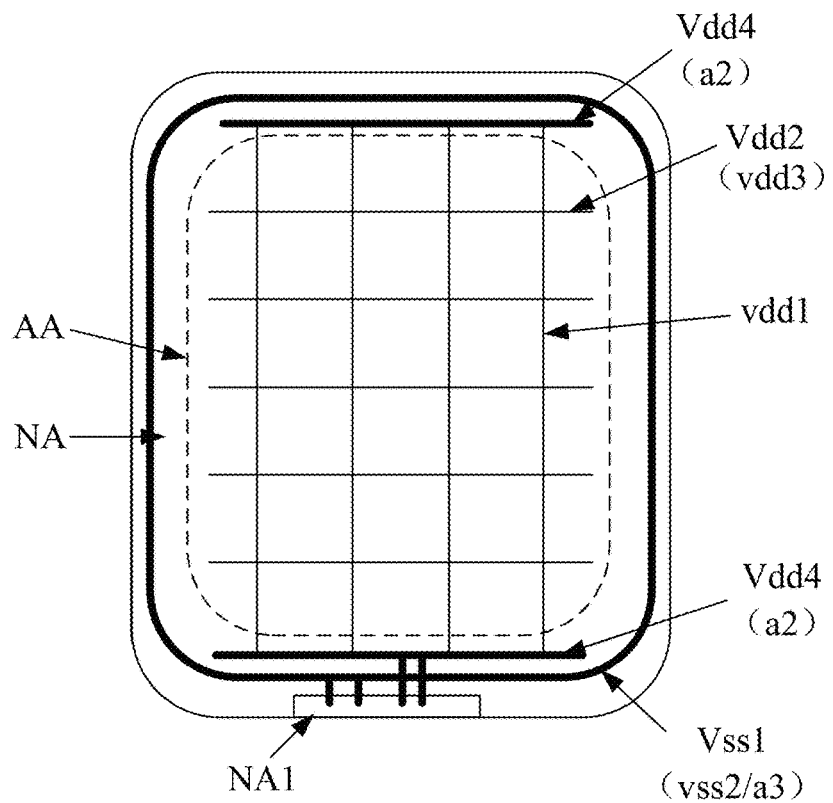
FIG. 4 is a schematic plan view illustrating a display substrate according to an embodiment of the present disclosure.
Figure 5:
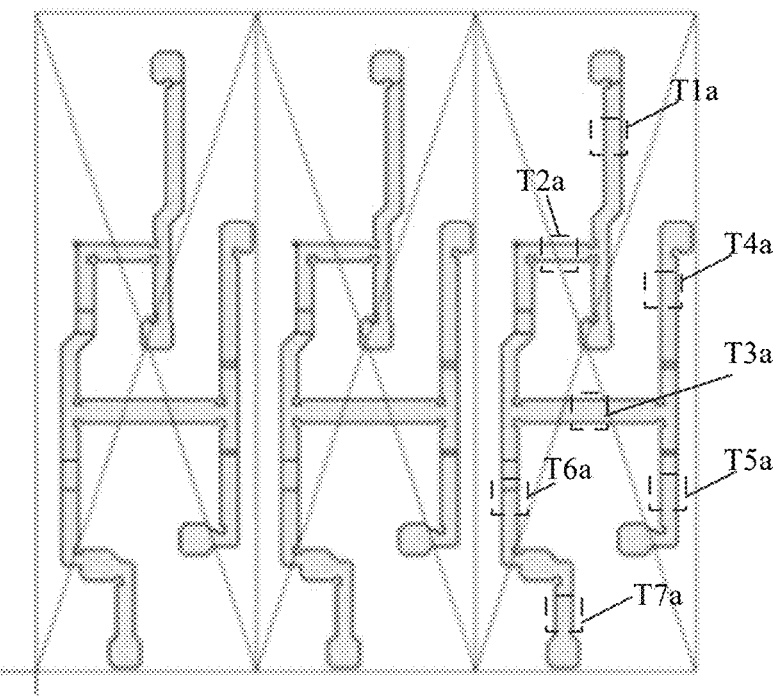
FIG. 5 is a layout of an active semiconductor layer according to an embodiment of the present disclosure.
Figure 6:
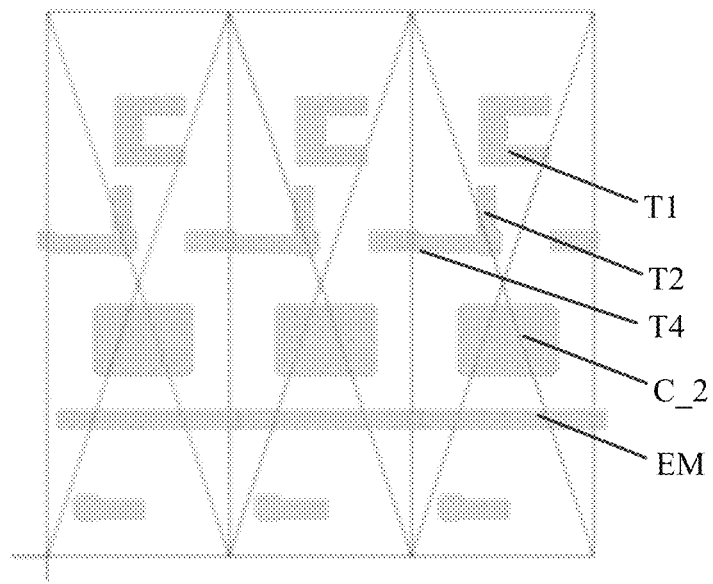
FIG. 6 is a layout of a fifth conductive layer according to an embodiment of the present disclosure.
Figure 7:
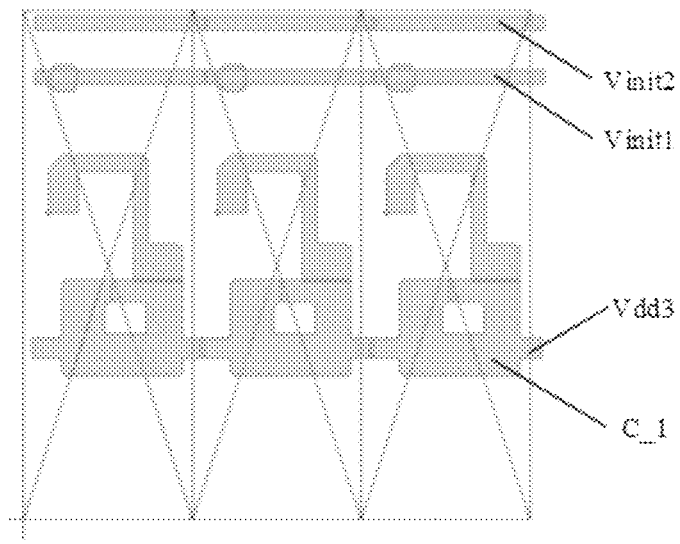
FIG. 7 is a layout of a fourth conductive layer according to an embodiment of the present disclosure.
Figure 8:
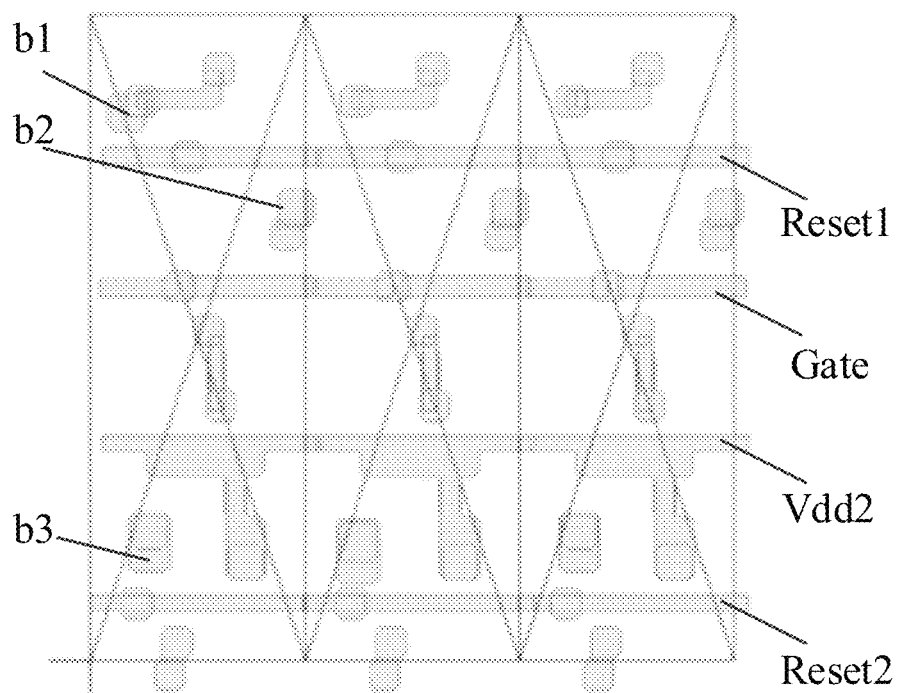
FIG. 8 is a layout of a third conductive layer according to an embodiment of the present disclosure.
Figure 9:
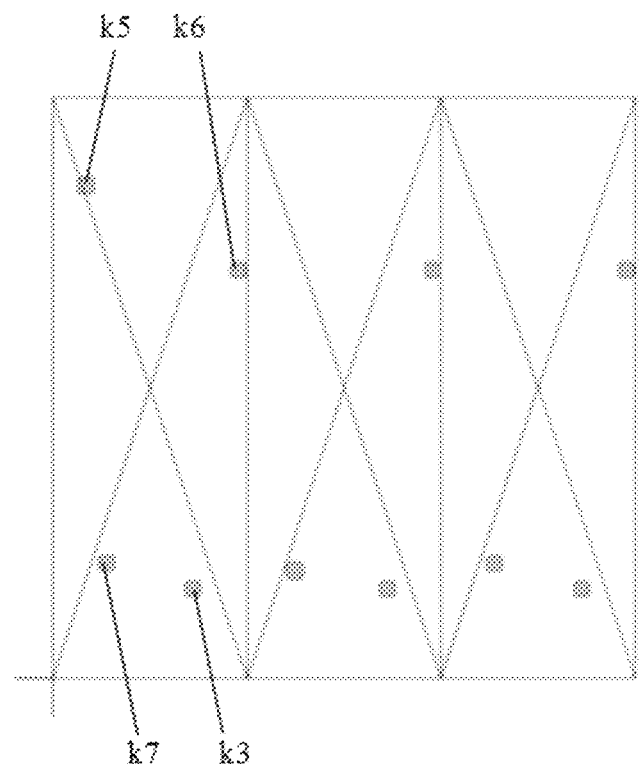
FIG. 9 is a layout of a passivation layer according to an embodiment of the present disclosure.
Figure 10:
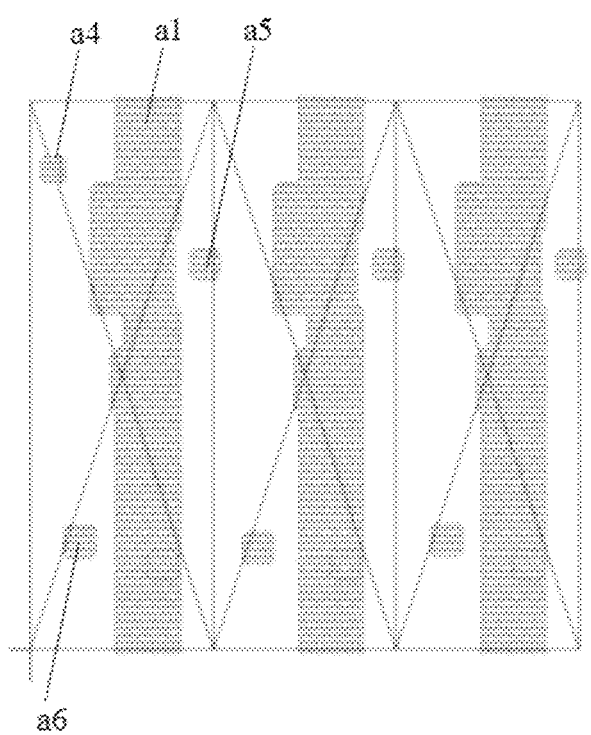
FIG. 10 is a layout of a second conductive layer according to an embodiment of the present disclosure.
Figure 11:
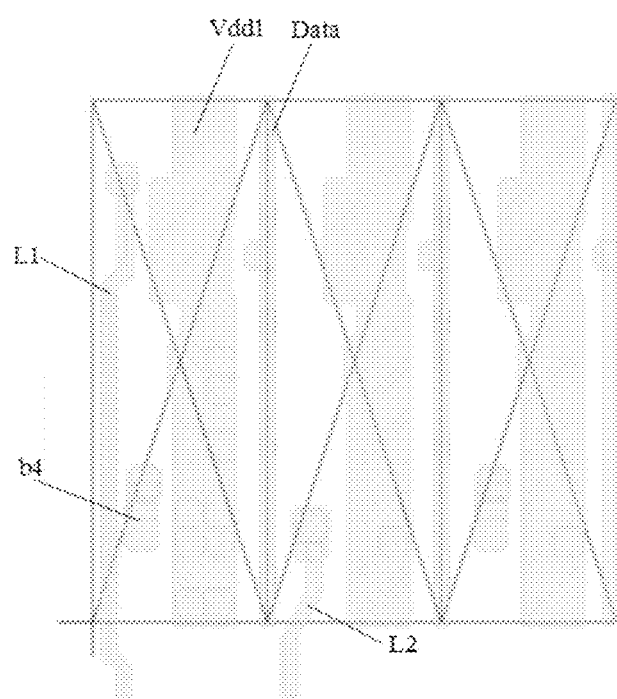
FIG. 11 is a layout of a first conductive layer according to an embodiment of the present disclosure.

FIG. 1 is a layout of a pixel driving circuit according to an embodiment of the present disclosure. FIG. 2 is a schematic diagram of a structure of a display substrate according to an embodiment of the present disclosure. FIG. 3 is a schematic diagram of a circuit structure of a pixel driving circuit according to an embodiment of the present disclosure. FIG. 4 is a schematic plan view illustrating a display substrate according to an embodiment of the present disclosure. FIG. 5 is a layout of an active semiconductor layer according to an embodiment of the present disclosure. FIG. 6 is a layout of a fifth conductive layer according to an embodiment of the present disclosure. FIG. 7 is a layout of a fourth conductive layer according to an embodiment of the present disclosure. FIG. 8 is a layout of a third conductive layer according to an embodiment of the present disclosure. FIG. 9 is a layout of a passivation layer according to an embodiment of the present disclosure. FIG. 10 is a layout of a second conductive layer according to an embodiment of the present disclosure. FIG. 11 is a layout of a first conductive layer according to an embodiment of the present disclosure.

As shown in FIGS. 1 to 4, 10 and 11, the display substrate includes: a base substrate 1, a buffer layer BFL, a driving functional layer 2, a first conductive layer CL1, a first planarization layer PLN1 and a second conductive layer CL2.

The base substrate 1 includes a display region AA and a peripheral region NA surrounding the display region AA.

The driving functional layer 2 is located on one side of the base substrate 1, and includes: pixel driving circuits located in the display region AA and arranged in an array along a first direction and a second direction, and the first direction intersects with the second direction.

The first conductive layer CL1 is located on a side of the driving functional layer 2 away from the base substrate 1, and includes a plurality of first power lines Vdd1 for providing a first operating voltage to the pixel driving circuits.

The first planarization layer PLN1 and the second conductive layer CL2 are both located between the driving functional layer 2 and the first conductive layer CL1, the first planarization layer PLN1 is located between the first conductive layer CL1 and the second conductive layer CL2, the second conductive layer CL2 includes a plurality of first conductive patterns a1, and the first conductive patterns a1 are electrically connected in parallel with the corresponding first power lines Vdd1 through first vias (not shown) in the first planarization layer PLN1.

In the display substrate provided by the embodiment of the present disclosure, the first conductive layer CL1 includes a plurality of first power lines Vdd1 configured to provide a first operating voltage, which is an anode voltage Vdd, to the pixel driving circuit. The second conductive layer CL2 includes a plurality of first conductive patterns a1 connected in parallel with the first power lines Vdd1, which is equivalent to the first conductive patterns a1 and the first power lines Vdd1 serving as Vdd traces in common. Further, in the parallel connection manner, an equivalent resistance of the first power lines Vdd1 can be reduced, so that the voltage drop of the Vdd traces can be eliminated, and the improvement of the brightness uniformity of the display substrate is facilitated.

It should be noted that the pixel driving circuit provided in the embodiment of the present disclosure may adopt 7T1C (7 transistors and 1 capacitor) shown in FIG. 3, which is only exemplary, and does not limit the technical solution of the present disclosure. The pixel driving circuit may also adopt structures with other numbers of transistors, such as a 7T2C structure, a 6T1C structure, a 6T2C structure, or a 9T2C structure, which is not limited in the embodiment of the present disclosure.

In some embodiments, as shown in FIG. 11, the first power lines Vdd1 extend in the second direction, and the first conductive patterns a1 extend in the second direction. An orthographic projection of each first conductive pattern a1 on the base substrate 1 at least partially overlaps with an orthographic projection of the corresponding first power line Vdd1 on the base substrate 1.

Optionally, the orthographic projection of each first conductive pattern a1 on the base substrate 1 may completely coincide with the orthographic projection of the corresponding first power line Vdd1 on the base substrate 1, or the orthographic projection of each first conductive pattern a1 on the base substrate 1 may be covered by the orthographic projection of the corresponding first power line Vdd1 on the base substrate 1, as long as it is ensured that the first conductive pattern a1 and the first power line Vdd1 corresponding to each other are connected to each other in parallel to enable the overall voltage drop of the Vdd traces to be reduced. The relationship between the projections of the first conductive pattern a1 and the first power line Vdd1 corresponding to each other is not limited in the embodiment of the present disclosure.

In some embodiments, as shown in FIG. 4, the first conductive layer CL1 further includes first peripheral power lines Vdd4 located in the peripheral region NA for transmitting the first operating voltage. The second conductive layer CL2 further includes second conductive patterns a2 located in the peripheral region NA, the second conductive patterns a2 are electrically connected in parallel to the corresponding first peripheral power lines Vdd4 through second vias in the first planarization layer PLN1. In the embodiment of the present disclosure, the first power lines Vdd1 and the first peripheral power lines Vdd4 are disposed in the same layer (both located in the first conductive layer CL1).

In some embodiments, the first peripheral power lines Vdd4 may be disposed on two opposite sides of the display region AA in the second direction, and two ends of each first power line Vdd1 may respectively extend to the peripheral region NA to be connected to the corresponding first peripheral power line Vdd4. By providing the first peripheral power lines Vdd4, the voltages at the ends of the first power lines Vdd1 can be kept consistent, which is beneficial to improving the uniformity of the voltages loaded on the first power lines Vdd1.

The second conductive patterns a2 connected in parallel with the first peripheral power lines Vdd4 are disposed in the second conductive layer CL2, so that the equivalent resistance at the position of the first peripheral power lines Vdd4 can be reduced, the voltage drop of the Vdd traces can be eliminated, and the brightness uniformity of the display substrate is easily improved.

In some embodiments, as shown in FIGS. 2, 3 and 8, the driving functional layer includes a plurality of gate lines Gate extending along the first direction, the pixel driving circuits are electrically connected to the corresponding gate lines Gate, the driving functional layer 2 includes a third conductive layer CL3 located on a side of the second conductive layer CL2 close to the base substrate 1, and including the gate lines Gate.

The first conductive layer CL1 further includes: fourth power lines Vss1 located in the peripheral region NA and configured to provide a second operating voltage to the pixel driving circuits; and/or, the third conductive layer CL3 includes: fifth power lines Vss2 located in the peripheral region NA and configured to provide the second operating voltage to the pixel driving circuits. The second conductive layer CL2 further includes: third conductive patterns a3, and the third conductive patterns a3 are electrically connected in parallel with the corresponding fourth power lines Vss1 and/or the corresponding fifth power lines Vss2.

In addition, the second operating voltage provided by the fourth power lines Vss1 and/or the fifth power lines Vss2 to the pixel driving circuits may be a cathode voltage Vss, and the second conductive layer CL2 further includes the plurality of third conductive patterns a3, and the third conductive patterns a3 may be connected in parallel with the fourth power lines Vss1 through vias in the first planarization layer PLN1, so as to reduce the voltage drop of the Vss traces. In the case that the fifth power lines Vss2 are included in the third conductive layer CL3, the third conductive patterns a3 are connected in parallel with the fifth power lines Vss2, that is, the fourth power lines Vss1, the third conductive patterns a3 and the fifth power lines Vss2 are all connected in parallel with each other, so that the voltage drop of the Vss traces is further reduced.

As shown in FIG. 2, the display substrate further includes a passivation layer PVX between the second conductive layer CL2 and the third conductive layer CL3, so that the third conductive patterns a3 in the second conductive layer CL2 and the fifth power lines Vss2 in the third conductive layer CL3 are connected in parallel with each other through vias in the passivation layer PVX.

Optionally, orthographic projections of the fourth power line Vss1 in the first conductive layer CL1, the third conductive pattern a3 in the second conductive layer CL2 and the fifth power line vss2 in the third conductive layer CL3 corresponding to each other on the base substrate 1 may completely coincide with each other or at least partially overlap with each other, which is not limited in the embodiment of the present disclosure. In the embodiments of the present disclosure, by providing the third conductive patterns a3 in the second conductive layer, the equivalent resistance at the Vss traces can be effectively reduced. Under the condition that the equivalent resistance at the vss traces is not changed, a line width of each fourth power line vss1 or each fifth power line vss2 can be properly reduced, so that the narrow-bezel design of a product is facilitated.

In addition, it should be noted that as shown in FIG. 4, the power lines for supplying/transmitting the first operating voltage VDD and for supplying/transmitting the second operating voltage VSS in the embodiment of the present disclosure may be connected to the bonding region NA1 located in the peripheral region NA, and a plurality of connection terminals (typically pads) are disposed in the bonding region NA1.

In some embodiments, as shown in FIGS. 8 and 9, the third conductive layer CL3 further includes: a plurality of second power lines Vdd2 for transmitting the first operating voltage, the second power lines Vdd2 extend in the first direction, and the first conductive patterns a1 are electrically connected to the corresponding second power lines Vdd2 through third vias k3 in the passivation layer PVX.

In the embodiment of the present disclosure, the second power lines Vdd2 have the same function as the first power lines Vdd1 and the first conductive patterns a1, that is, all of them are used to transmit the first operating voltage to the pixel driving circuits, but the extending direction of the second power lines Vdd2 is the first direction and intersects with the extending directions of the first power lines Vdd1/ the first conductive patterns a1. At this time, the Vdd traces formed by the second power lines Vdd2, the first power lines Vdd1 and the first conductive patterns a1 for transmitting the first operating voltage is a mesh structure. With such a design, the overall equivalent resistance of the Vdd traces can be reduced, and the uniformity of the voltage loaded at positions on the Vdd traces can be improved.

In some embodiments, as shown in FIG. 2, the driving functional layer 2 further includes: an active semiconductor layer 4, a first insulating layer GI1, a fifth conductive layer CL5, a second insulating layer GI2, a fourth conductive layer CL4 and an interlayer insulating layer ILD sequentially arranged along a direction away from the base substrate 1, wherein the fourth conductive layer CL4 is located on a side of the interlayer insulating layer ILD away from the third conductive layer CL3.

As shown in FIG. 5, it should be noted that the active semiconductor layer 4 includes patterns of active regions (also referred to as channel regions) and source-drain doped regions (including source regions and drain regions) of the transistors in the pixel driving circuits. The active semiconductor layer 4 may include an integrally formed low temperature polysilicon layer in which the source regions and the drain regions of the transistors may be conductorized by doping, to realize the electric connection. That is, the patterns of the active regions and the source-drain doped regions of the transistors in each pixel driving circuit are a whole pattern formed by p-silicon, and the patterns of the active regions of different transistors can be separated by a doped structure.

For example, the active semiconductor layer 4 may be made of amorphous silicon, polycrystalline silicon, an oxide semiconductor material, or the like. The source regions and the drain regions may be regions doped with n-type or p-type impurities.

As shown in FIGS. 3, 6 and 7, each pixel driving circuit further includes a driving transistor T3 and a storage capacitor C, a first plate C_1 of the storage capacitor C is electrically connected to the first power line Vdd1, and a second plate C_2 of the storage capacitor C is electrically connected to a control electrode of the driving transistor T3.

The first plate C_1 of the storage capacitor C is located in the fourth conductive layer CL4, and the control electrode of the driving transistor T3 and the second plate C_1 of the storage capacitor C are located in the fifth conductive layer CL5.

The fourth conductive layer CL4 further includes: a plurality of third power lines Vdd3 for transmitting the first operating voltage, each third power line Vdd3 is connected to the first plate C_1 of the storage capacitor C and extends in the first direction; the third power lines Vdd3 are electrically connected in parallel with the corresponding second power lines Vdd2 through fourth vias (not shown) in the interlayer insulating layer ILD, so that the equivalent resistance at the second power lines Vdd2 can be reduced.

Based on this, the first power lines Vdd1 and the first conductive patterns a1 form a dual-layer Vdd traces extending along the second direction, the second power lines Vdd2 and the third power lines Vdd3 form a dual-layer Vdd traces extending along the first direction, and the third power lines Vdd3 are electrically connected to the second power lines Vdd2, so that the Vdd traces having a mesh structure are formed on the display substrate, which is beneficial to reducing the voltage drop on the Vdd traces.

As shown in FIGS. 3 and 6, each pixel driving circuit further includes: a first reset transistor T1, a control electrode of the first reset transistor T1 is electrically connected to a first reset control signal line Reset1, a first electrode of the first reset transistor T1 is electrically connected to a first reset voltage transmission line Vinit1, and a second electrode of the first reset transistor T1 is electrically connected to the control electrode of the driving transistor T3.

In some implementations, reset voltage connection lines L1 are disposed in the first conductive layer CL1, and each reset voltage connection line L1 connects the first reset voltage transmission lines Vinit1 corresponding to two adjacent pixel driving circuits in the second direction. With such reset voltage connecting lines L1, the uniformity of the voltage applied to the two adjacent first reset voltage transmission lines Vinit1 can be effectively improved.

As shown in FIGS. 7 and 11, the first reset voltage transmission lines Vinit1 are located in the fourth conductive layer CL4 and extend along the first direction, and the reset voltage connection lines L1 are located in the first conductive layer CL1 and extend along the second direction. The first reset voltage transmission lines Vinit1 are electrically connected to the corresponding reset voltage connection lines L1.

It should be understood that the conductive patterns formed in each layer in the display substrate are formed through an etching process, i.e., after being coated with photoresist, exposed to light, and developed, the conductive patterns are formed by etching with an etching solution. Referring to FIG. 2, the third conductive layer CL3 is located on a side of the second conductive layer CL2 close to the base substrate 1, and the passivation layer PVX is located between the second conductive layer CL2 and the third conductive layer CL3. In the process for manufacturing the base substrate, the third conductive layer CL3 is formed firstly, and then the second conductive layer CL2 is formed.

Generally, materials of the third conductive layer CL3 and the second conductive layer CL2 are both metal materials, and the etching solution used in the process of patterning the second conductive layer CL2 by the etching process may generate an etching effect on a material film in the third conductive layer CL3 when the etching solution is in contact with the material in the third conductive layer CL3. In an actual process, since a plurality of vias exist in the passivation layer PVX, when the conductive patterns in the second conductive layer CL2 are formed, the etching solution may seep into the third conductive layer CL3 through the vias in the passivation layer PVX to cause a false etching on the conductive patterns in the third conductive layer CL3 (for example, the second power lines vdd2, the first electrodes and the second electrodes of the transistors, and the like), so that defective products may occur.

In order to solve the problem that the etching solution cause the false etching of the conductive patterns in the third conductive layer CL3 through the vias in the passivation layer PVX, the conductive patterns in the second conductive layer CL2 are required to be formed to shield the positions where the vias, through which the conductive patterns in the third conductive layer CL3 are exposed, are formed in the passivation layer PVX.

In some embodiments, as shown in FIGS. 8 and 10, the third conductive layer CL3 further includes: first adapter electrodes b1. The first reset voltage transmission lines Vinit1 are electrically connected to the corresponding reset voltage connection lines L1 through the first adapter electrodes b1. The first reset voltage transmission lines Vinit1 are electrically connected to the corresponding first adapter electrodes b1 through fifth vias k5 in the passivation layer PVX.

The second conductive layer CL2 further includes fourth conductive patterns a4, an orthographic projection of each fourth conductive pattern a4 on the base substrate 1 covers an orthographic projection of a portion of the corresponding first adapter electrode b1 exposed by the fifth via k5 on the base substrate 1, so as to prevent the etching solution from seeping into the third conductive layer CL3 through the fifth vias k5 in the passivation layer PVX, and thus avoid the false etching on the first adapter electrodes b1 in the third conductive layer CL3.

Specifically, the first reset voltage transmission lines Vinit1 are located in the fourth conductive layer CL4, and the reset voltage connection lines L1 are located in the first conductive layer CL1. The following are provided between the first conductive layer CL1 and the fourth conductive layer CL4: the first planarization layer PLN1, the second conductive layer CL2, the passivation layer PVX, the third conductive layer CL3, and the interlayer insulating layer ILD in a direction close to the base substrate 1. Therefore, in order to connect the first reset voltage transmission line Vinit1 to the corresponding reset voltage connection line L1, the reset voltage connection line L1 in the first conductive layer CL1 is connected to the corresponding fourth conductive pattern a4 in the second conductive layer CL2 through a via in the first planarization layer PLN1, the fourth conductive pattern a4 in the second conductive layer CL2 is connected to the corresponding first adapter electrode b1 in the third conductive layer CL3 through the fifth via k5 in the passivation layer PVX, and the first adapter electrode b1 in the third conductive layer CL3 is connected to the corresponding first reset voltage transmission line Vinit1 in the fourth conductive layer CL4 through a via in the interlayer insulating layer ILD.

As shown in FIGS. 3 and 6, the first reset transistor T1 is located in the fifth conductive layer CL5, the second electrode of the first reset transistor T1 is further electrically connected to the second plate C_2 of the storage capacitor C, and the first plate C_1 of the storage capacitor C is connected to the first power line Vdd1. An orthographic projection of the first power line Vdd1 corresponding to the storage capacitor C on the base substrate covers an orthographic projection of the first reset transistor T1 corresponding to the storage capacitor C on the base substrate.

In some embodiments, as shown in FIGS. 6 and 11, the first conductive layer CL1 further includes a plurality of data lines Data extending in the second direction. As shown in FIG. 3, each pixel driving circuit further includes a data writing transistor T4, a control electrode of the data writing transistor T4 is electrically connected to the corresponding gate line Gate, a first electrode of the data writing transistor T4 is electrically connected to the corresponding data line Data, and a second electrode of the data writing transistor T4 is electrically connected to a first electrode of the driving transistor T3.

In some embodiments, the third conductive layer CL3 further includes: second adapter electrodes b2. Each data line Data is electrically connected to the first electrode of the corresponding data writing transistor T4 through the second adapter electrode b2, and is electrically connected to the corresponding second adapter electrode b2 through a sixth via k6 in the passivation layer PVX.

The second conductive layer CL2 further includes fifth conductive patterns a5. An orthographic projection of each fifth conductive pattern a5 on the base substrate 1 covers an orthographic projection of a part of the corresponding second adapter electrode b2 exposed by the sixth via k6 on the base substrate 1, so as to prevent the etching solution from seeping into the third conductive layer CL3 through the sixth vias k6 in the passivation layer PVX, and thus avoid the false etching on the second adapter electrodes b2 in the third conductive layer CL3.

Specifically, the data lines Data are located in the first conductive layer CL1, and the first electrode of each data writing transistor T4 is located in the fifth conductive layer CL5. The following are provided between the first conductive layer CL1 and the fifth conductive layer CL5: the first planarization layer PLN1, the second conductive layer CL2, the passivation layer PVX, the third conductive layer CL3, the interlayer insulating layer ILD, the fourth conductive layer CL4, and the second insulating layer GI2 in a direction close to the base substrate 1. Therefore, in order to electrically connect the data line Data to the first electrode of the data writing transistor T4, the data line Data in the first conductive layer CL1 is connected to the corresponding fifth conductive pattern a5 in the second conductive layer CL2 through vias in the first planarization layer PLN1, the fifth conductive pattern a5 in the second conductive layer CL2 is connected to the corresponding second adapter electrode b2 in the third conductive layer CL3 through sixth vias k6 in the passivation layer PVX, the second adapter electrode b2 in the third conductive layer CL3 is connected to the corresponding conductive pattern in the fourth conductive layer CL4 through vias in the interlayer insulating layer ILD, and the conductive pattern in the fourth conductive layer CL4 is connected to the first electrode of the data writing transistor T4 through vias in the second insulating layer GI2.

As shown in FIG. 2, the display substrate further includes light-emitting elements EL on a side of the first conductive layer CL1 away from the base substrate 1, each light-emitting element EL including: a first electrode 31, a light-emitting layer 33, and a second electrode 32 provided sequentially in a direction away from the first conductive layer CL1. Specifically, the display substrate further includes a second planarization layer PLN2 and a pixel defining layer PDL on a side of the first planarization layer PLN1 away from the base substrate 1, and the pixel defining layer PDL is on a side of the second planarization layer PLN2 away from the first planarization layer PLN1; the pixel defining layer PDL is provided with pixel openings therein, through which at least a portion of each first electrode 31 is exposed, and the light-emitting layer is provided in the corresponding pixel opening. In one example, the first electrode 31 may be an anode, the second electrode 32 may be a cathode, and the light-emitting layer may include: a hole injection layer, a hole transport layer, a luminescent layer, an electron transport layer, and an electron injection layer, which are sequentially stacked.

It should be noted that in the embodiment of the present disclosure, the light-emitting device is a top emission type light-emitting device. Optionally, the first electrode 31 may be a reflective electrode made of a metal material, and the second electrode may be a transparent electrode made of a transparent conductive material (for example, indium tin oxide).

In some embodiments, as shown in FIG. 10, the third conductive layer CL3 further includes: third adapter electrodes b3. A second electrode of a second reset transistor T7 is electrically connected to the corresponding first electrode 31 through the third adapter electrode b3, and the first electrode 31 is electrically connected to the corresponding third adapter electrode b3 through a seventh via k7 in the passivation layer PVX.

The second conductive layer CL2 further includes sixth conductive patterns a6. An orthographic projection of each sixth conductive pattern a6 on the base substrate 1 covers an orthographic projection of the exposed portion of the corresponding third adapter electrode b3 by the seventh via k7 on the base substrate 1, so as to prevent the etching solution from seeping into the third conductive layer CL3 through the seventh via k7 in the passivation layer PVX, and thus avoid the false etching on the third adapter electrodes b3 in the third conductive layer CL3, thereby ensuring the display effect of the display substrate.

Referring to FIG. 3, each pixel driving circuit further includes a second light-emitting control transistor T6, a control electrode of the second light-emitting control transistor T6 is electrically connected to a light-emitting control signal line EM, a first electrode of the second light-emitting control transistor T6 is electrically connected to the second electrode of the driving transistor T3, and a second electrode of the second light-emitting control transistor T6 is electrically connected to the first electrode 31 of the light-emitting element EL. Meanwhile, a second electrode of the second reset transistor T7 is electrically connected to the second electrode of the second light-emitting control transistor T6, and in order to electrically connect the second electrode of the second light-emitting control transistor T6 to the first electrode 31, the third adapter electrodes b3 may be located in the third conductive layer CL3. Further, the structure located in the active semiconductor layer 4 is electrically connected to the corresponding first electrode 31 through the third adapter electrode b3, thereby realizing the connection between the second electrode of the second light-emitting control transistor T6 and the first electrode 31.

As shown in FIGS. 1 and 3, each pixel driving circuit further includes a second reset transistor T7, a control electrode of the second reset transistor T7 is electrically connected to a second reset control signal line Reset2, a first electrode of the second reset transistor T7 is electrically connected to a second reset voltage transmission line Vinit2, and a second electrode of the second reset transistor T7 is electrically connected to the first electrode 31. Optionally, the source regions and the drain regions of the transistors in the pixel driving circuits may be conductorized by doping in the active semiconductor layer 4, to realize the electrical connection. The second electrode of the second reset transistor T7 and the second electrode of the second light-emitting control transistor T6 may be connected together in the active semiconductor layer 4 to have a one-piece structure.

In some embodiments, as shown in FIG. 2, the first conductive layer CL1 further includes: a fourth adapter electrode b4. The first electrode 31 is electrically connected to the corresponding third adapter electrode b3 through the fourth adapter electrode b4; the fourth adapter electrode b4 is in contact with the corresponding sixth conductive pattern a6 through a via in the first planarization layer PLN1; the sixth conductive pattern a6 is in contact with the corresponding third adapter electrode b3 through the corresponding seventh via k7, thereby electrically connecting the second electrode of the second reset transistor T7 with the first electrode 31.

Generally, materials of the conductive patterns in the first conductive layer CL1 and in the second conductive layer CL2 are both metal materials, and a plurality of vias are provided in the first planarization layer PLN1 located between the first conductive layer CL1 and the second conductive layer CL2. When the first conductive layer CL1 is formed, the conductive patterns should be provided in the first conductive layer CL1 at positions corresponding to the vias in the first planarization layer PLN1, to prevent the etching solution used for etching the conductive patterns in the first conductive layer CL1 from seeping into the second conductive layer CL2 through the vias in the first planarization layer PLN1 and thus avoid the false etching on the conductive patterns in the second conductive layer CL2.

In one example, an orthographic projection of each fourth adapter electrode b4 on the base substrate 1 covers an orthographic projection of the corresponding sixth conductive pattern a6 on the base substrate 1, so as to prevent the etching solution from seeping into the second conductive layer CL2 through the vias in the first planarization layer PLN1 and thus avoid the false over-etching on the sixth conductive patterns a6 in the second conductive layer CL2.

In addition, the display substrate includes the plurality of light-emitting elements EL, each corresponding to a pixel driving circuit. When a position of an orthographic projection of a region where the first electrode of each light-emitting element EL is located on the base substrate is far away from a position of an orthographic projection of the second electrode of the second light-emitting control transistor in the corresponding pixel driving circuit on the base substrate, connection lines L2 are provided in the first conductive layer CL1 for connecting the second electrode of the second light-emitting control transistor and the first electrode of the corresponding light-emitting element EL.

In some embodiments, as shown in FIG. 3, each pixel driving circuit further includes: a threshold compensating transistor T2 and a first light-emitting control transistor T5. A control electrode of the first light-emitting control transistor T5 is electrically connected to a light-emitting control signal line EM, a first electrode of the first light-emitting control transistor T5 is electrically connected to an operating voltage transmission line, and a second electrode of the first light-emitting control transistor T5 is electrically connected to a first electrode of the driving transistor T3. The operating voltage transmission line is configured to provide the first operating voltage; the threshold compensating transistor T2 may be a thin film transistor of a dual gate structure, a first control electrode of the threshold compensating transistor T2 may be a portion where the gate line Gate overlaps with the active semiconductor layer 4, and a second control electrode of the threshold compensating transistor T2 may be a portion where a protrusion protruding from the gate line Gate overlaps with the active semiconductor layer 4; the control electrode of the driving transistor T3 and the second plate C_1 of the storage capacitor C may have the one-piece structure.

As shown in FIG. 5, a portion of the active semiconductor layer 4 within a dashed-line rectangular block denoted by Tna represents a pattern of an active region of a transistor Tn, 1≤n≤7 and n is a positive integer. Illustratively, a portion of the active semiconductor layer 4 within a dashed-line rectangular block denoted by T1a represents a pattern of an active region of the first reset transistor T1, and the patterns of the active regions and the source-drain doped regions of the transistors in the same pixel driving circuit are integrally formed as a single piece.

Based on the same inventive concept, the embodiment of the present disclosure further provides a display apparatus, which includes the display substrate in the above embodiments. For the description of the display substrate, reference may be made to the contents in the foregoing embodiments, and details are not repeated herein.

It should be noted that in the embodiment of the present disclosure, the display apparatus may be any product or component having a display function, such as a flexible wearable device, a mobile phone, a tablet computer, a television, a display, a notebook computer, a digital photo frame, or a navigator, or the like. Other essential components of the display apparatus are understood by one of ordinary skill in the art and are not described herein or should not be construed as limiting the invention.

Further, the display apparatus may further include various types of display apparatus, such as an organic electroluminescence display apparatus (e.g., an OLED display apparatus, a QLED display apparatus), a mini diode (mini LED) display apparatus, which is not limited herein.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising:
    a base substrate comprising a display region and a peripheral region surrounding the display region;
    a driving functional layer on one side of the base substrate, and comprising: pixel driving circuits in the display region and arranged in an array along a first direction and a second direction, wherein the first direction intersects with the second direction;
    a first conductive layer on a side of the driving functional layer away from the base substrate, and comprising a plurality of first power lines configured to provide a first operating voltage to the pixel driving circuits; and
    a first planarization layer and a second conductive layer both of which are between the driving functional layer and the first conductive layer, wherein the first planarization layer is between the first conductive layer and the second conductive layer, the second conductive layer comprises a plurality of first conductive patterns, and each of the plurality of first conductive patterns is electrically connected in parallel with a corresponding first power line of the plurality of first power lines through a first via in the first planarization layer;
    wherein the first conductive layer further comprises a first peripheral power line in the peripheral region configured to transmit the first operating voltage;
    the second conductive layer further comprises a second conductive pattern in the peripheral region; and
    the second conductive pattern is electrically connected in parallel with the first peripheral power line through a second via in the first planarization layer.

2. The display substrate of claim 1, wherein the plurality of first power lines extend in the second direction, and the plurality of first conductive patterns extend in the second direction; and
    an orthographic projection of each first conductive pattern on the base substrate at least partially overlaps with an orthographic projection of its corresponding first power line on the base substrate.

3. The display substrate of claim 1, wherein the driving functional layer comprises a plurality of gate lines extending along the first direction, and the pixel driving circuit is electrically connected to a corresponding gate line;
    the driving functional layer comprises a third conductive layer on a side of the second conductive layer close to the base substrate and comprising the plurality of gate lines;
    the first conductive layer further comprises: fourth power lines in the peripheral region and configured to provide a second operating voltage to the pixel driving circuits; and the third conductive layer comprises: fifth power lines in the peripheral region and configured to provide the second operating voltage to the pixel driving circuits; and the second conductive layer further comprises: third conductive patterns, and the third conductive patterns are electrically connected in parallel with corresponding fourth power lines and the corresponding fifth power lines, respectively.

4. The display substrate of claim 1, wherein the driving functional layer comprises a plurality of gate lines extending along the first direction, and the pixel driving circuits are electrically connected to corresponding gate lines, respectively;

the driving functional layer comprises a third conductive layer on a side of the second conductive layer close to the base substrate and comprising the plurality of gate lines;

the third conductive layer further comprises: a plurality of second power lines configured to transmit the first operating voltage and extending in the first direction, and the display substrate further comprises:

a passivation layer between the second conductive layer and the third conductive layer, wherein the first conductive patterns are electrically connected to corresponding second power lines through third vias in the passivation layer, respectively.

5. The display substrate of claim 4, wherein the driving functional layer further comprises: a fourth conductive layer on a side of the third conductive layer close to the base substrate, and a fifth conductive layer on a side of the fourth conductive layer close to the base substrate;

each pixel driving circuit comprises a driving transistor and a storage capacitor, wherein a first plate of the storage capacitor is electrically connected to the first power line, and a second plate of the storage capacitor is electrically connected to a control electrode of the driving transistor;

the first plate of the storage capacitor is in the fourth conductive layer, and the second plate of the storage capacitor and the control electrode of the driving transistor are in the fifth conductive layer; and the display substrate further comprises:

an interlayer insulating layer between the third conductive layer and the fourth conductive layer.

6. The display substrate of claim 5, wherein the fourth conductive layer further comprises: a plurality of third power lines configured to transmit the first operating voltage, and each third power line is connected to the first plate of the storage capacitor and extends in the first direction; and the plurality of third power lines are electrically connected to the corresponding second power lines through fourth vias in the interlayer insulating layer, respectively.

7. The display substrate of claim 5, wherein each pixel driving circuit further comprises: a first reset transistor, a control electrode of the first reset transistor is electrically connected to a first reset control signal line, a first electrode of the first reset transistor is electrically connected to a first reset voltage transmission line, and a second electrode of the first reset transistor is electrically connected to the second plate of the storage capacitor;

the first reset voltage transmission line is in the fourth conductive layer and extends along the first direction, the first conductive layer further comprises: reset voltage connection lines in the first conductive layer and extending along the second direction; and the first reset voltage transmission lines corresponding to two adjacent pixel driving circuits in the second direction are electrically connected to each other through a corresponding reset voltage connection line.

8. The display substrate of claim 7, wherein the third conductive layer further comprises: first adapter electrodes; and the first reset voltage transmission lines are electrically connected to the corresponding reset voltage connection lines through the first adapter electrodes, respectively;

the first reset voltage transmission lines are electrically connected to the corresponding first adapter electrodes through fifth vias in the passivation layer, respectively; and the second conductive layer further comprises fourth conductive patterns, and an orthographic projection of each fourth conductive pattern on the base substrate covers an orthographic projection of a portion of the corresponding first adapter electrode exposed by the fifth via on the base substrate.

9. The display substrate of claim 7, wherein an orthographic projection of the first power line corresponding to the storage capacitor on the base substrate covers an orthographic projection of the first reset transistor corresponding to the storage capacitor on the base substrate.

10. The display substrate of claim 5, wherein the first conductive layer further comprises a plurality of data lines extending in the second direction; and each pixel driving circuit further comprises a data writing transistor, a control electrode of the data writing transistor is electrically connected to a corresponding gate line, a first electrode of the data writing transistor is electrically connected to a corresponding data line, and a second electrode of the data writing transistor is electrically connected to the first electrode of the driving transistor.

11. The display substrate of claim 10, wherein the third conductive layer further comprises: second adapter electrodes, each data line is electrically connected to the first electrode of the corresponding data writing transistor through the second adapter electrode;

each data line is electrically connected to the corresponding second adapter electrode through a sixth via in the passivation layer; and the second conductive layer further comprises fifth conductive patterns, and an orthographic projection of each fifth conductive pattern on the base substrate covers an orthographic projection of a part of the corresponding second adapter electrode exposed by the sixth via on the base substrate.

12. The display substrate of claim 5, wherein the display substrate further comprises light-emitting elements on a side of the first conductive layer away from the base substrate, each light-emitting element comprising: a first electrode, a light-emitting layer, and a second electrode provided sequentially in a direction away from the first conductive layer;

each pixel driving circuit further comprises: a second light-emitting control transistor, a control electrode of the second light-emitting control transistor is electrically connected to a light-emitting control signal line, a first electrode of the second light-emitting control transistor is electrically connected to the second electrode of the driving transistor, and a second electrode of the second light-emitting control transistor is electrically connected to the first electrode of the corresponding light-emitting element;

the third conductive layer further comprises: third adapter electrodes, and the second electrode of the second light-emitting control transistor is electrically connected to the first electrode of the corresponding light-emitting element through the third adapter electrode;

the first electrode of the light-emitting element is electrically connected to the corresponding third adapter electrode through a seventh via in the passivation layer; and the second conductive layer further comprises sixth conductive patterns, and an orthographic projection of each sixth conductive pattern on the base substrate covers an orthographic projection of the portion of the corresponding third adapter electrode exposed by the seventh via on the base substrate.

13. The display substrate of claim 12, wherein the first conductive layer further comprises fourth adapter electrodes, and the first electrode of the light-emitting element is electrically connected to the corresponding third adapter electrode through the fourth adapter electrode;

each fourth adapter electrode is in contact with the corresponding sixth conductive pattern through a via in the first planarization layer; and each sixth conductive pattern is in contact with the corresponding third adapter electrode through the corresponding seventh via.

14. A display apparatus, comprising the display substrate of claim 1.

15. The display substrate of claim 2, wherein the driving functional layer comprises a plurality of gate lines extending along the first direction, and the pixel driving circuits are electrically connected to corresponding gate lines, respectively;

the driving functional layer comprises a third conductive layer on a side of the second conductive layer close to the base substrate and comprising the plurality of gate lines;

the third conductive layer further comprises: a plurality of second power lines configured to transmit the first operating voltage and extending in the first direction, and the display substrate further comprises:

a passivation layer between the second conductive layer and the third conductive layer, wherein the first conductive patterns are electrically connected to corresponding second power lines through third vias in the passivation layer, respectively.

16. The display substrate of claim 6, wherein each pixel driving circuit further comprises: a first reset transistor, a control electrode of the first reset transistor is electrically connected to a first reset control signal line, a first electrode of the first reset transistor is electrically connected to a first reset voltage transmission line, and a second electrode of the first reset transistor is electrically connected to the second plate of the storage capacitor;

the first reset voltage transmission line is in the fourth conductive layer and extends along the first direction, the first conductive layer further comprises: reset voltage connection lines in the first conductive layer and extending along the second direction; and the first reset voltage transmission lines corresponding to two adjacent pixel driving circuits in the second direction are electrically connected to each other through a corresponding reset voltage connection line.

17. The display substrate of claim 6, wherein the first conductive layer further comprises a plurality of data lines extending in the second direction; and each pixel driving circuit further comprises a data writing transistor, a control electrode of the data writing transistor is electrically connected to a corresponding gate line, a first electrode of the data writing transistor is electrically connected to a corresponding data line, and a second electrode of the data writing transistor is electrically connected to the first electrode of the driving transistor.

18. A display substrate, comprising:

a base substrate comprising a display region and a peripheral region surrounding the display region;

a driving functional layer on one side of the base substrate, and comprising: pixel driving circuits in the display region and arranged in an array along a first direction and a second direction, wherein the first direction intersects with the second direction;

a first conductive layer on a side of the driving functional layer away from the base substrate, and comprising a plurality of first power lines configured to provide a first operating voltage to the pixel driving circuits; and a first planarization layer and a second conductive layer both of which are between the driving functional layer and the first conductive layer, wherein the first planarization layer is between the first conductive layer and the second conductive layer, the second conductive layer comprises a plurality of first conductive patterns, and each of the plurality of first conductive patterns is electrically connected in parallel with a corresponding first power line of the plurality of first power lines through a first via in the first planarization layer;

wherein two ends of each of the plurality of first power lines and the plurality of first conductive patterns extend to the peripheral region in the second direction.

* * * * *